(12) United States Patent
Sebesta et al.

(10) Patent No.: US 6,900,545 B1
(45) Date of Patent: May 31, 2005

(54) VARIABLE THICKNESS PADS ON A SUBSTRATE SURFACE

(75) Inventors: Robert David Sebesta, Endicott, NY (US); James Warren Wilson, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/526,957

(22) Filed: Mar. 16, 2000

Related U.S. Application Data

(62) Division of application No. 09/344,031, filed on Jun. 25, 1999, now Pat. No. 6,077,766.

(51) Int. Cl.[7] .......................... H01L 23/02; H01L 29/40
(52) U.S. Cl. ....................... 257/775; 257/778; 257/686; 257/786
(58) Field of Search ................................. 257/775, 778, 257/686, 786, 773, 276, 748, 751, 784; 438/613, 667, 618, 620, 614, 617; 361/760

(56) References Cited

U.S. PATENT DOCUMENTS

| | | | |
|---|---|---|---|
| 3,343,256 A | | 9/1967 | Smith et al. |
| 3,518,751 A | * | 7/1970 | Waters .......................... 29/577 |
| 3,715,635 A | * | 2/1973 | Michel et al. ............... 257/775 |
| 4,021,838 A | * | 5/1977 | Warwick ..................... 257/207 |

(Continued)

FOREIGN PATENT DOCUMENTS

| | | | |
|---|---|---|---|
| JP | 62-145851 | * | 6/1987 |
| JP | 02-43748 | * | 2/1990 |
| JP | 05-615323 | * | 11/1993 |
| JP | 06-198936 | * | 7/1994 |
| JP | 10032371 | * | 2/1998 |
| JP | 100093215 A | * | 4/1998 |
| JP | 11-307678 | * | 11/1999 |
| KR | 019743767 | * | 7/1998 |

Primary Examiner—Kamand Cuneo
Assistant Examiner—James Mitchell
(74) Attorney, Agent, or Firm—Schmeiser, Olsen & Watts; William H. Steinberg

(57) ABSTRACT

An electronic structure, and associated method of fabrication, that includes a substrate having attached circuit elements and conductive bonding pads of varying thickness. Pad categories relating to pad thickness include thick pads (17 to 50 microns), medium pads (10–17 microns), and thin pads (3 to 10 microns). A thick pad is used for coupling a ball grid array (BGA) to a substrate with attachment of the BGA to a circuit card. A medium pad is useful in flip-chip bonding of a chip to a substrate by use of an interfacing small solder ball. A thin copper pad, coated with a nickel-gold layer, is useful for coupling a chip to a substrate by use of a wirebond interface. The electrical structure includes an electrical coupling of two pads having different thickness, such that the pads are located either on the same surface of a substrate or on opposite sides of a substrate.

14 Claims, 8 Drawing Sheets

U.S. PATENT DOCUMENTS

| | | | | |
|---|---|---|---|---|
| 4,191,789 A | * | 3/1980 | Brown et al. | 427/97 |
| 4,718,977 A | * | 1/1988 | Contiero et al. | 438/648 |
| 4,791,006 A | * | 12/1988 | Galvagni et al. | 101/127 |
| 4,959,510 A | * | 9/1990 | Matsusaka et al. | 174/261 |
| 5,001,605 A | * | 3/1991 | Savagian et al. | 174/266 |
| 5,208,658 A | * | 5/1993 | Murata | 257/758 |
| 5,214,308 A | * | 5/1993 | Nishiguchi et al. | 257/692 |
| 5,249,101 A | * | 9/1993 | Frey et al. | 361/717 |
| 5,294,486 A | * | 3/1994 | Paunovic et al. | 428/672 |
| 5,541,368 A | * | 7/1996 | Swamy | 174/257 |
| 5,541,369 A | * | 7/1996 | Tahara et al. | 174/117 FF |
| 5,592,736 A | | 1/1997 | Akram et al. | |
| 5,594,275 A | * | 1/1997 | Kwon et al. | 257/685 |
| 5,629,835 A | | 5/1997 | Mahulikar et al. | |
| 5,638,597 A | * | 6/1997 | Cutting et al. | 29/830 |
| 5,640,047 A | * | 6/1997 | Nakashima | 257/738 |
| 5,677,566 A | | 10/1997 | King et al. | |
| 5,706,178 A | | 1/1998 | Barrow | |
| 5,739,585 A | | 4/1998 | Akram et al. | |
| 5,767,008 A | * | 6/1998 | Haji | 438/612 |
| 5,767,575 A | * | 6/1998 | Lan et al. | 133/227 |
| 5,784,262 A | * | 7/1998 | Sherman | 174/261 |
| 5,885,400 A | | 3/1999 | Davis et al. | |
| 5,977,640 A | * | 11/1999 | Bertin et al. | 257/777 |
| 6,031,292 A | * | 2/2000 | Murakami et al. | 257/737 |
| 6,050,832 A | * | 4/2000 | Lee et al. | 439/66 |
| 6,080,494 A | * | 6/2000 | Abbott | 228/180.22 |
| 6,144,090 A | * | 11/2000 | Higashiguchi | 257/693 |
| 6,162,664 A | * | 12/2000 | Kim | 438/126 |
| 6,221,682 B1 | * | 4/2001 | Danziger et al. | 438/15 |
| 6,335,104 B1 | * | 1/2002 | Sambucetti et al. | 427/125 |
| 6,365,978 B1 | * | 4/2002 | Ibnabdeljalil et al. | 257/693 |
| 6,366,466 B1 | * | 4/2002 | Leddige et al. | 174/261 |
| 6,583,503 B2 | * | 6/2003 | Akram et al. | 257/686 |
| 2002/0000665 A1 | * | 1/2002 | Barrr et al. | 257/758 |

* cited by examiner

VARIABLE THICKNESS PADS ON A SUBSTRATE SURFACE

This application is a divisional of Ser. No. 09/344,031, filed on Jun. 25, 1999 now U.S. Pat. No. 6,077,766.

BACKGROUND OF THE INVENTION

1. Technical Field

The present invention relates to a structure, and associated method of formation, in which conductive bonding pads and associated circuit elements of varying height are located on the same substrate.

2. Related Art

A substrate, such as a chip carrier, typically has a top surface and a bottom surface wherein either surface, or both surfaces, has conductive bonding pads for electrically coupling the substrate to such devices as electronic assemblies (e.g., chips) and electronic carriers (e.g, circuit cards). A conductive bonding pad typically contains copper, but may alternatively contain, inter alia, nickel. Currently, all pads on a given substrate have the same thickness. A reduction in pad thickness generally conserves space on the substrate as a consequence of the outward sloping of pad sidewalls from the top of the pad to the bottom of the pad. The outward sloping is generated by the subtractive etching process used to form the pads. The outward, or trapezoidal, sloping causes the cross-sectional area of the pad at a pad-substrate interface to decrease with decreasing pad thickness for a given angular slope. The reduction of pad cross-sectional area at the pad-substrate interface allows the pad centers to be more closely spaced, resulting in an overall reduction of the substrate surface area required for implementing the design features of intended applications. The foregoing remarks regarding the use of thin pads to conserve space also apply to circuit lines coupled to the pads inasmuch as the circuit lines may likewise be formed by subtractive etching and consequently have sloping sidewalls. Indeed, a pad may be viewed as volumetric section of a circuit line to which a conductive interconnect, such as a wirebond interconnect or a solder ball, may be electrically and mechanically coupled. Thus, both thin pads and associated thin circuit lines improve space utilization. Pads (and associated circuitizations) may be categorized as to thickness. Such categories include thin pads, thick pads, and medium pads.

A thick pad (and associated circuitization), which typically has a thickness between about 17 microns and about 50 microns, can generally be used for coupling electrical devices and is especially useful for coupling a large solder ball, such as a solder ball of a ball grid array (BGA), to a substrate for subsequent attachment of the large solder ball to a circuit card.

A thin pad (and associated circuitization), which typically has a thickness between about 3 microns and about 10 microns, can be used for coupling an electronic assembly (e.g., a chip) to a substrate, by use of a wirebond interface (e.g., a gold wire). However, pads are typically made of copper and copper is unsuitable for making a direct attachment of a chip to a substrate by use of a gold wire. To mitigate this problem, the copper pad may be coated with a layer of nickel-gold, wherein a coating of nickel is formed on a top surface of the copper pad, and wherein a coating of gold is formed on the coating of nickel. With the nickel-gold layer over a copper pad, the chip may be wirebonded directly to the gold coating and this wirebond connection is generally reliable. A thin or thick copper pad, with an overlying nickel-gold layer, could also be used for attachment of a BGA solder ball. Note that a thin pad without an overlying nickel-gold layer generally cannot be used for direct attachment of a BGA solder ball, because the soldering process alloys some of the pad metal (e.g., copper) into the bulk of the solder material (e.g., lead/tin). Thus, if the pad is too thin, nearly all of the pad metal may alloy with the solder material, resulting in an unreliable mechanical and electrical connection.

A medium pad (and associated circuitization) has a thickness between about 10 microns and about 17 microns. A medium pad is particularly useful in flip-chip bonding of a chip to a substrate by use of a small solder ball. Such flip-chip bonding may be accomplished by the controlled collapse chip connection (C4) technique. The diameter of the small solder ball may be nearly an order of magnitude smaller than the diameter of a BGA solder ball (e.g., 2 to 3 mils for a small solder ball versus 25 to 30 mils for a BGA solder ball). The relatively smaller solder ball diameter allows the pad thickness for small solder ball attachment to be less than the pad thickness for BGA solder ball attachment, due to consideration of the alloying of pad metal with the solder material as discussed supra.

It is to be noted that a BGA solder ball can be directly soldered to nickel-gold coating over a thin copper pad, which conserves space. There is controversy, however, as to whether the solder-gold interface is susceptible to joint degradation. Thus, some designers and/or users may prefer to couple a BGA solder ball to a substrate by using a thick, uncoated copper pad than by using a nickel-gold coated thin copper pad. The decision of whether to couple a BGA solder ball to a substrate by using a thick copper pad or a thin nickel-gold coated copper pad is therefore discretionary and involves balancing the space-saving features of thin pads against reliability concerns associated with thin nickel-gold coated thin copper pads. For applications requiring low-power input to a chip and low processing speed, it may be desirable to have thin circuitization throughout the substrate except where thick BGA pads are required. For applications requiring high-power input to a chip and high processing speed, it may be desirable to have thick circuitization throughout the substrate except where thin wirebond pads are required.

Currently, pads and associated circuit lines on a given substrate are of uniform thickness throughout the substrate. It would be desirable to have pads and associated circuit lines of is differing thicknesses on the same substrate in order to benefit from the advantages associated with each pad thickness and circuit line thickness.

SUMMARY OF THE INVENTION

The present invention provides an electronic structure, comprising:

a substrate;

a first circuit line including a first conductive pad and having a first thickness, wherein the first circuit line is coupled to the substrate; and a second circuit line including a second conductive pad and having a second thickness that is unequal to the first thickness, wherein the second circuit line is coupled to the substrate, and wherein the second circuit line is electrically coupled to the first circuit line.

The present invention also provides a method for forming an electronic structure, comprising:

providing a substrate;

forming a first circuit line that includes a first conductive pad and has a first thickness;

coupling the first circuit line to the substrate;
forming a second circuit line that includes a second conductive pad and has a second thickness that is unequal to the first thickness;
coupling the second circuit line to the substrate; and
electrically coupling the second circuit line to the first circuit line.

The present invention has the advantage of allowing pads and associated circuit lines on the same substrate to have different thicknesses, which enables the benefits associated with each circuit line thickness and each pad thickness to be realized.

The present invention has the advantage of allowing thick BGA pads and thin wirebond pads to exist on the same substrate.

The present invention has the advantage of allowing thick BGA pads and medium C4 solder-ball pads to exist on the same substrate.

The present invention has the advantage of allowing thin wirebond pads and medium C4 solder-ball pads to exist on the same substrate.

The present invention has the advantage of allowing applications requiring low-power input to a chip and low processing speed to have thin circuitization throughout the substrate except where thick BGA pads are required.

The present invention has the advantage of applications requiring high-power input to a chip and high processing speed to have thick circuitization throughout the substrate except where thin wirebond pads are required.

DETAILED DESCRIPTION OF THE INVENTION

Figure 1:
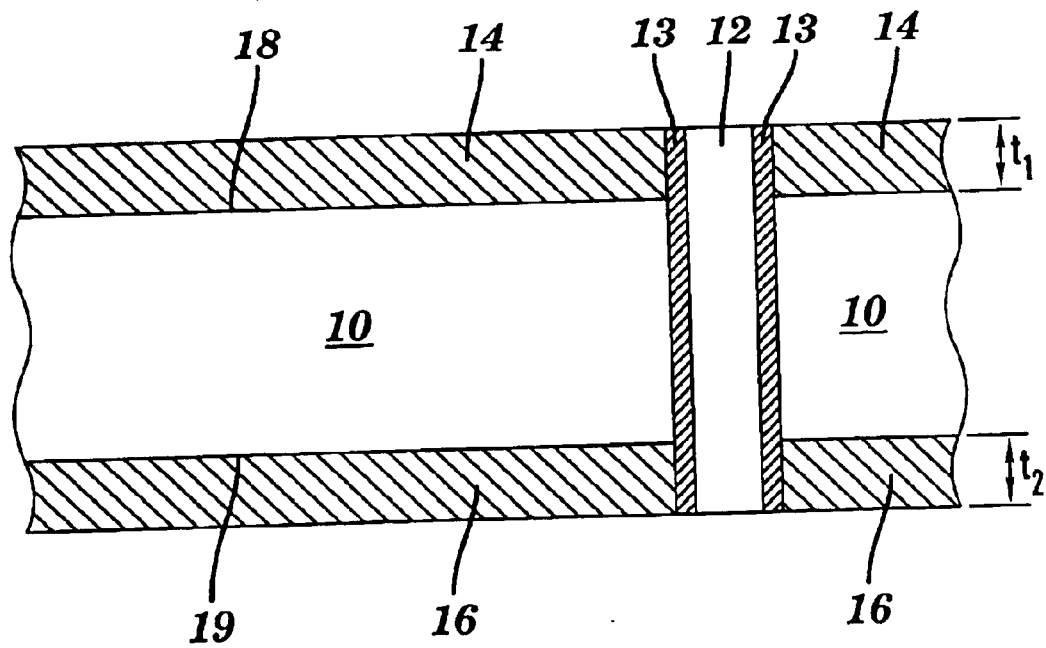
FIG. 1 depicts a front cross-sectional view of a substrate with a plated through hole (PTH) and added metal foil layers, in accordance with an initial step of a preferred embodiment of the process of the present invention.

FIGS. 1–8 illustrate a preferred embodiment of the method of the present invention. FIG. 1 illustrates a front cross-sectional view of a substrate 10 with a plated through hole (PTH) 12, a top layer of metal foil 14 on the top surface 18 of the substrate 10, and a bottom layer of metal foil 16 on the bottom surface 19 of the substrate 10. The substrate 10 may represent a it device such as a chip carrier. The PTH 12 has a plated metal inner wall 13 for providing conductive coupling between circuitizations to be subsequently formed on both the top surface 18 and the bottom surface 19. The PTH may be filled with an insulative material to prevent seepage of matter into the PTH during subsequent fabrication steps. The top layer of metal foil 14 on the top surface 18, having a thickness $t_1$, may be formed by any known method. It is common to first form a metal foil of standard thickness exceeding t, on the top surface 18, followed by chemically etching the metal foil down to the thickness $t_1$. The thickness $t_2$ of the bottom layer of metal foil 16 may be formed by any known method, including a method similar to that used for forming the thickness $t_1$ of the top layer of metal foil 14. Note that $t_2$ may be unequal to $t_1$. The material of the top layer metal foil 14, and of the bottom layer of metal foil 16, may be any material that could be used for forming conductive pads and associated circuit lines. A conductive pad typically contains copper, but may alternatively contain, inter alia, nickel.

Figure 2:
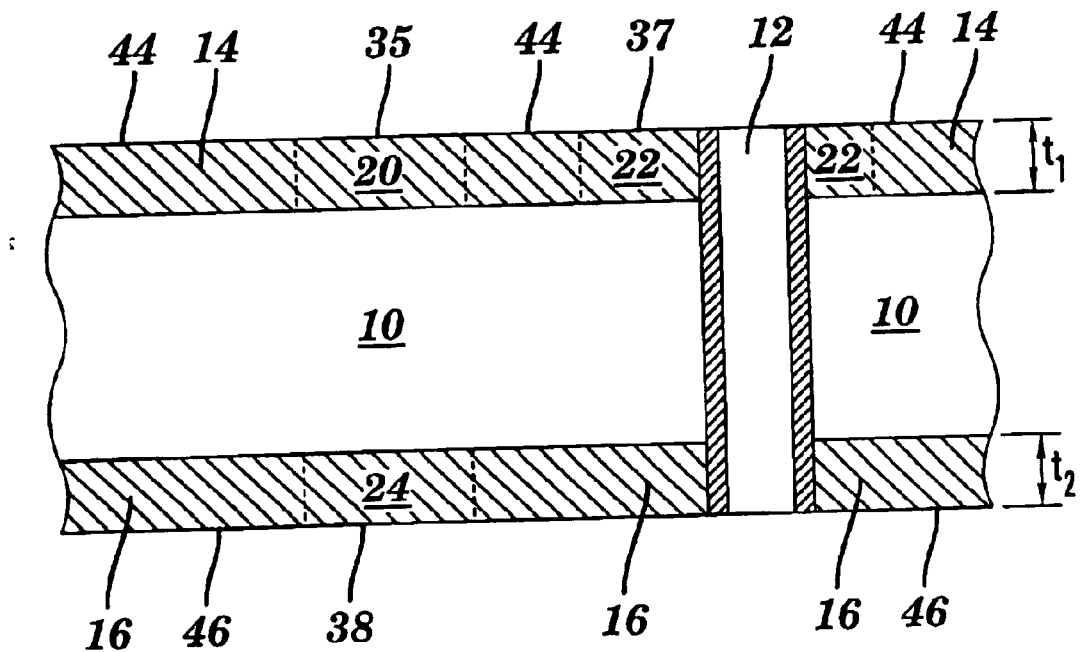
FIG. 2 depicts FIG. 1 with indicated regions to be circuitized to thicknesses of the metal foil layers.
Figure 3:
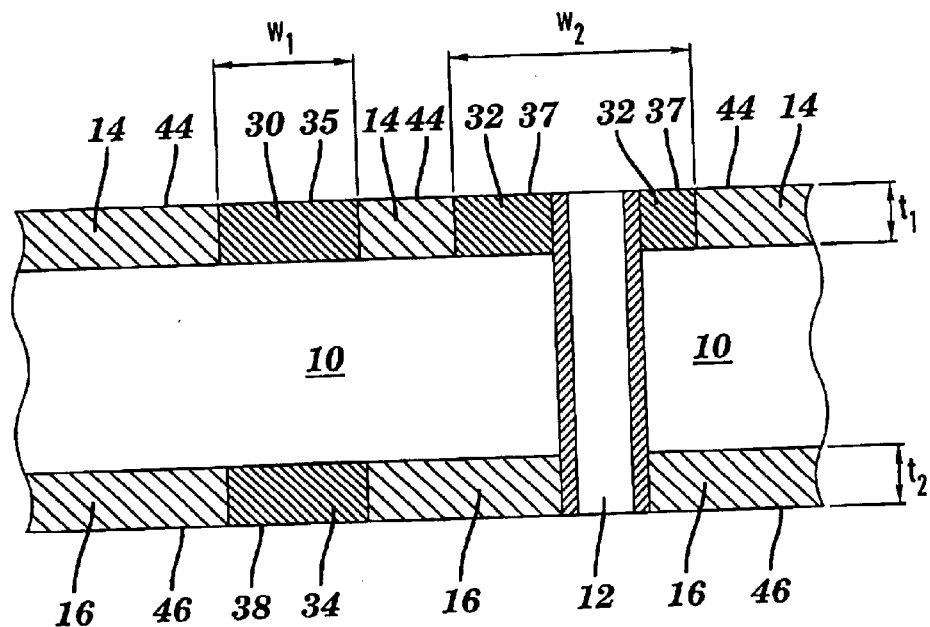
FIG. 3 depicts FIG. 2 after the indicated regions have been circuitized to form first, second, and third circuit lines.

FIG. 2 illustrates FIG. 1 after identification of regions to be subsequently circuitized, namely regions 20 and 22 within the top layer of metal foil 14, and region 24 within the bottom layer of metal foil 16. FIG. 3 illustrates FIG. 2 after formation of a first circuit line 30 of thickness $t_1$, a second circuit line 32 of thickness $t_1$, and a third circuit line 34 of thickness $t_2$, from regions 20, 22, and 24 (see FIG. 2 for regions 20, 22, and 24), respectively. The first circuit line 30, second circuit line 32, and third circuit line 34 in FIG. 3 may be formed by any method known in the art, such as by photolithography with subtractive etching. Employing photolithography includes applying, exposing, developing, etching, and stripping steps. In the applying step, photoresist is applied to the open surfaces of the metal foil layers 14 and 16 in FIG. 2. An open surface is defined as a surface that is open to (i.e., in contact with) the atmosphere. In the exposing step, the photoresist-covered surfaces under which circuitizations will be subsequently formed are selectively exposed to light of a suitable wavelength (e.g., ultraviolet light). With particular reference to FIG. 2, the light is selectively directed to surfaces under which the first circuit line 30, the second circuit line 32, and the third circuit line 34 will be subsequently formed; i.e., to the surface 35 of region 20, the surface 37 of region 22, and the surface 38 of region 24. The light is also directed to surfaces under which additional circuitizations will be subsequently formed as will be described infra, namely the open surfaces 44 of the top layer of metal foil 14 and the open surfaces 46 of the bottom layer of metal foil 14, as shown in FIG. 2 and FIG. 3. The photoresist that is exposed to the selectively directed light is protected in the subsequent developing step. In the developing step, the photoresist is developed away from surfaces not previously exposed (said surfaces not shown in FIG. 3). In the etching step, the unprotected metal (i.e., unexposed metal) of the metal foil layers 14 and 16 is removed by chemical etching, resulting in the formation of circuit lines 30, 32, and 34 shown in FIG. 3.

The removal of the unprotected metal generates void space adjacent to circuit lines 30, 32, and 34. This void space is not depicted in FIG. 3, because the cross-sectional view of FIG. 3 does not traverse the void space. The projected widths w, and w, of the first circuit line 30 and the second circuit line 32, respectively, serve to correlate the top view of FIG. 4 with the cross-sectional view of FIG. 3. After the etching step, some metal foil 14 and some metal foil 16 remains, namely the metal foil 14 having open surfaces 44, and the metal foil 16 having open surfaces 46. In the stripping step, the exposed photoresist is stripped away.

In FIG. 3: the first circuit line 30 is shown as on the top surface 18 (see FIG. 1 for top surface 18) of the substrate 10 and not embedded into the substrate 10; the second circuit line 32 is shown as on the top surface 18 of the substrate 10 and not embedded into the substrate 10; and the third circuit line 34 is shown as on the bottom surface 19 (see FIG. 1 for bottom surface 19) of the substrate 10 and not embedded into the substrate 10.

Figure 4:
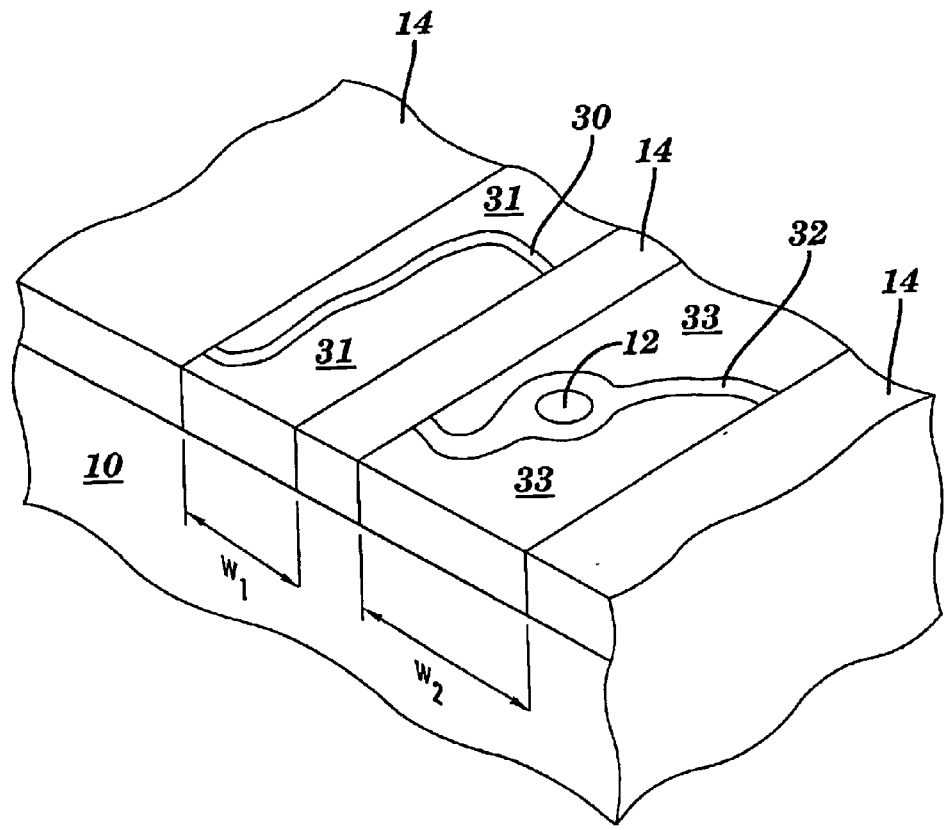
FIG. 4 depicts a top perspective view of the configuration of FIG. 3.

FIG. 4 illustrates of top view of the configuration of FIG. 3, showing the top layer of metal foil 14 and not showing the bottom layer of metal foil 16. The aforementioned subtractive etching process (described supra in conjunction with FIG. 3) generates a first void space 31 surrounding the first circuit line 30, and a second void space 33 surrounding the second circuit line 32, as shown in FIG. 4. The first void space 31 and the second void space 33 define the geometric features of the first circuit line 30 and the second circuit line 32, respectively. The projected widths $w_1$ and $w_2$ of the first circuit line 30 and the second circuit line 32, respectively, serve to correlate the top view of FIG. 4 with the front view of FIG. 3. Although FIG. 4 does not show the third circuit line 34 of FIG. 3, it should be noted that there is void space around the third circuit line 34 that defines the geometric features of third circuit line 34. While the first circuit line 30 is only one circuit line within the first void space 31, as illustrated in FIG. 4, the process of the present invention could generate a plurality of circuit lines within the first void space 31 such that void space exists between each pair of adjacent circuit lines. Similarly, the second void space 33 could include a plurality of circuit lines. It should be noted that a circuit line, such as the first circuit line 30 or the second circuit line 32, may include a designated volumetric section (i.e., a "pad") for subsequent coupling with an electrical connector, such as a wirebond connector or a solder ball. A "pad" is defined as a volumetric section of a circuit line to which a conductive interconnect, such as a wirebond interconnect or a solder ball, may be electrically and mechanically coupled.

Figure 5:
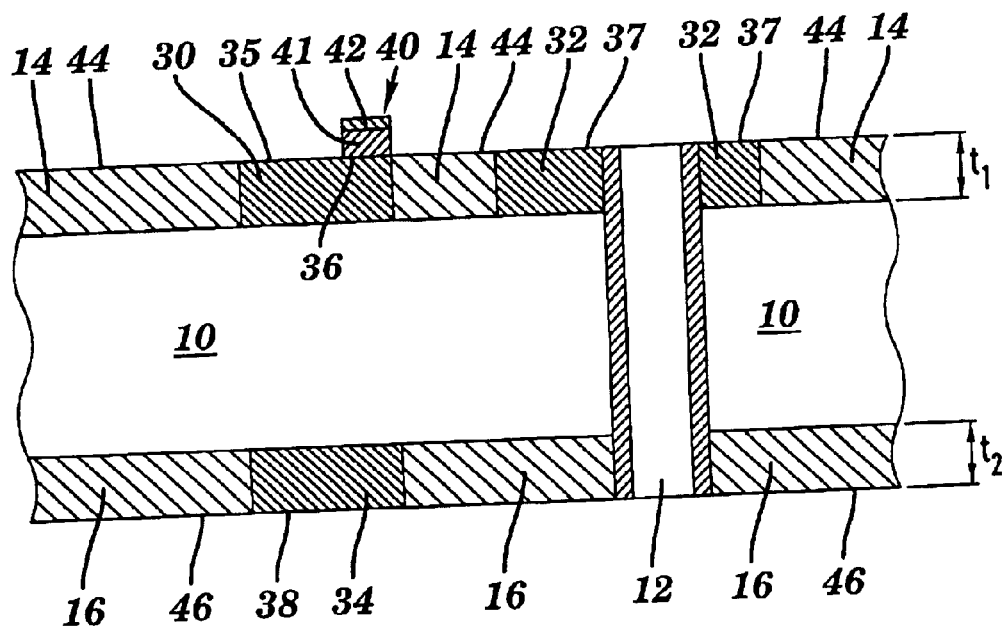
FIG. 5 depicts FIG. 3 after metallic coatings have been formed on a surface of the first circuit line.

FIG. 5 illustrates FIG. 3 after a metallic coating 40 is formed by any known method, such as plating (e.g., electroplating), on a portion 36 of the open surface 35 of the first circuit line 30. The metallic coating 40 may serve to conductively couple a wirebond interface, such as a gold wire, to the portion 36. The metallic coating 40 may be formed by any method known by one skilled in the art. A known method involves photolithographic steps comprising applying, exposing, developing, plating, and stripping steps. In the applying step, photoresist is applied to all currently open surfaces 44 of the first metal foil layer 14, the open surfaces 46 of the second metal foil layer 16, the open surface 35 of the first circuit line 30, the open surface 37 of the second circuit line 32, and the open surface 3B of the third circuit line 34. The purpose of applying photoresist to all open surfaces is to protect all open surfaces from being plated in the subsequent plating step, except those open surfaces which are exposed in the subsequent exposing in step that precedes the plating step. Next, in the exposing step, light of a suitable wavelength (e.g., ultraviolet light) is selectively directed to portions of the photoresist-covered surfaces which will not be subsequently plated by the metallic coating 40. In particular, light of the wavelength will not be directed to the portion 36 of the open surface 35 of the first circuit line 30. The photoresist that is exposed to the selectively directed light is protected in the subsequent developing step. In the developing step, the photoresist is developed away from surfaces not previously exposed to light, namely the portion 3 (i.e., the copper in the first circuit line 30). In the plating step, the metallic coating 40 is plated on the portion 36. In the stripping step, the exposed photoresist is stripped away. For some applications, the metallic coating 40 includes a first metallic coating 41 plated on the portion 36, and a second metallic coating 42 plated on the first metallic coating 41. For example, a wirebond interface of a gold wire cannot directly bond with the first circuit line 30 made of copper. To solve this particular problem, the metallic coating 40 includes a first metallic coating 41 made of nickel, and second metallic coating 42 made of gold. The second metallic coating 42 could alternatively be made of, inter alia, palladium. The nickel in the first metallic coating 41 acts as a diffusion barrier to prevent gold from diffusing into the copper material located underneath the portion 36. The first metallic coating 41 should be at least about 2.5 microns thick in order to effectively serve as a diffusion barrier and also to reliably maintain its structural integrity. The second metallic coating 42 should be at least about 0.5 microns thick in order to be reliably bond with a wirebond interface.

Figure 6:
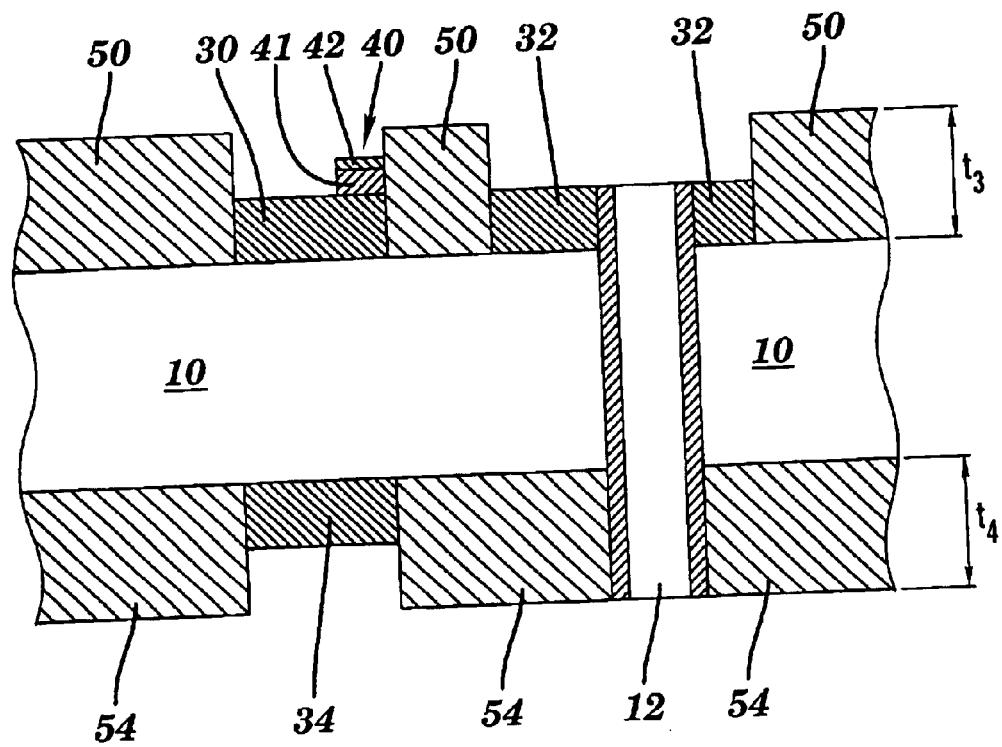
FIG. 6 depicts FIG. 5 after metal has been plated on the metal foil to form metal layers.

FIG. 6 depicts FIG. 5 after the layer of metal foil 14 (see FIG. 5) is transformed into a top metal layer 50 of thickness $t_3$ that exceeds $t_1$, and after the layer of metal foil 16 (see FIG. 5) is transformed into a top metal layer 54 of thickness $t_4$ that exceeds $t_2$. Returning to FIG. 5, the aforementioned transformations are accomplished in several steps. First, all open surfaces (44, 35, 40, 37, 46, and 38) are covered with photoresist. Second, all photoresist-covered surfaces, except surfaces 44 and 46, are protectively exposed to light of a suitable wavelength such as ultraviolet light. Third, the unexposed photoresist on surfaces 44 and 46 is developed away.

Fourth, the same metal as is in the top layer of metal foil 14 is plated on the open surfaces 44 to form, together with underneath top layer metal foil 14, the top metal layer 50 shown in FIG. 6. Similarly, the same metal as is in the bottom layer of metal foil 16 is plated on the open surfaces 46 to form, together with underneath bottom layer metal foil 16, the bottom metal layer 54. The remaining exposed surfaces are protected from being plated.

Figure 7:
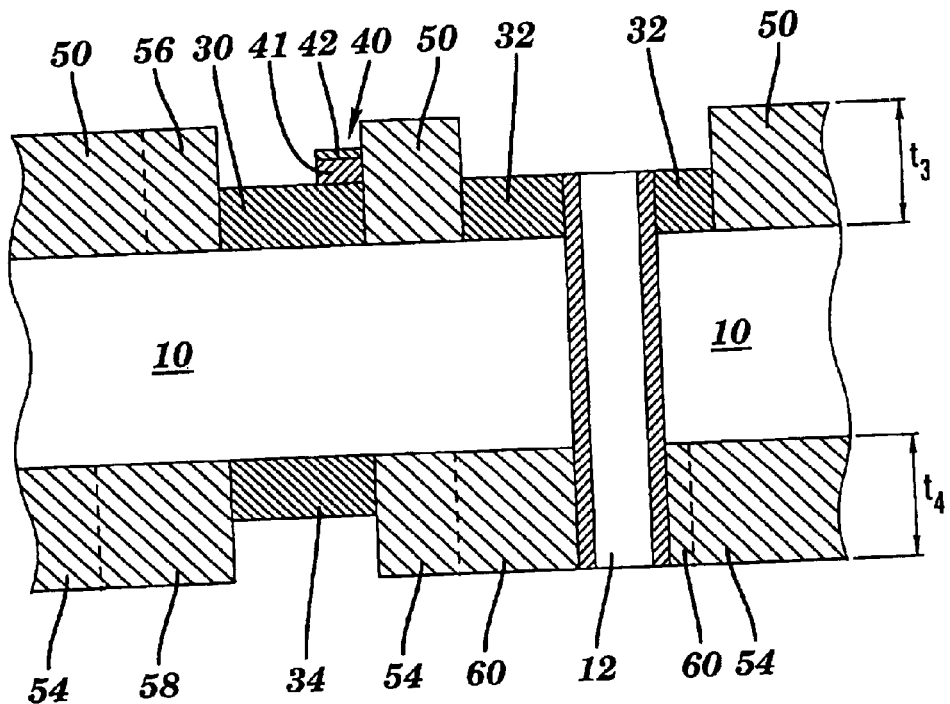
FIG. 7 depicts FIG. 6 with indicated regions to be circuitized to thicknesses of the metal layers.
Figure 8:
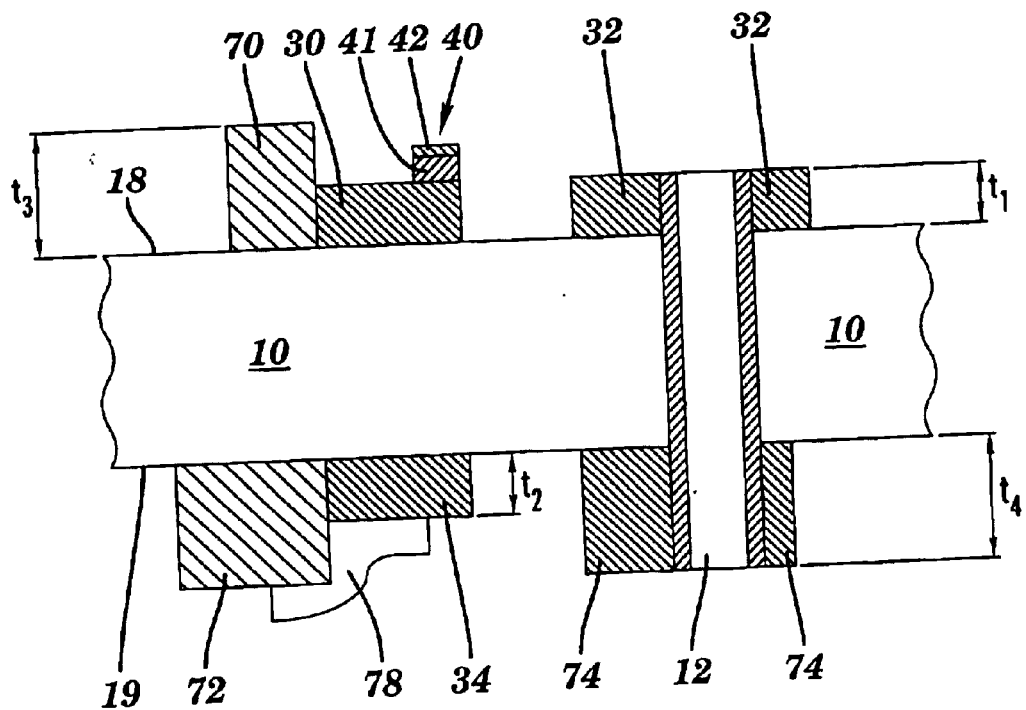
FIG. 8 depicts FIG. 7 after the indicated regions have been circuitized to form fourth, fifth, and sixth circuit lines.

FIG. 7 illustrates FIG. 6 after identification of regions to be subsequently circuitized, namely region 56 within the top metal layer 50, and regions 58 and 60 within the bottom metal layer 54. FIG. 8 illustrates FIG. 7 after formation of a fourth circuit line 70 of thickness $t_3$ a fifth circuit line 72 of thickness $t_4$ and a sixth circuit line 74 of thickness $t_4$, from regions 56, 58, and 60 (see FIG. 7 for regions 56, 58, and 60), respectively. The fourth circuit line 70, fifth circuit line 72, and sixth circuit line 74 in FIG. 8 may be formed by any method known in the art, such as by subtractive etching. With subtractive etching in consideration of the existing exposed photoresist (discussed supra in connection with FIG. 6), the unprotected metal (i.e., unexposed metal) of the top metal layer 50, as well as the unprotected metal of the bottom metal layer 54, is removed by chemical etching so as to form the fourth circuit line 70, the fifth circuit line 72, and the sixth circuit line 74. Next, the exposed photoresist is stripped away. It should be noted that any volumetric portion of circuit lines 70, 72, and 74 may constitute a "pad" for subsequent coupling with an electrical connector, such as a wirebond interconnect or a solder ball.

The preceding steps, resulting in the electronic structure illustrated in FIG. 8, for forming the top metal layer 50 and the bottom metal layer 54 and subsequently forming circuit lines 70, 72, and 74, may be repeated to form additional circuitization layers. In particular, the relevant steps (applying photoresist, selectively exposing the photoresist, developing away unexposed photoresist, plating metal on unexposed surfaces, and subtractive etching to define circuit line geometric features) may be used to form a top circuitization layer of thickness $t_3$, (exceeding $t_3$) on the top surface 18 of the substrate 10, and a circuitization layer of thickness $t_4$, (exceeding $t_4$) on the bottom surface 19 of the substrate 10. In this manner an arbitrary finite number of circuitization layers may be generated on a substrate by the method of the present invention. Each formed circuitization layer has a greater thickness than the prior formed circuitization layers on the same surface (top surface 18 or bottom surface 19) of the substrate 10.

After all circuitization layers have been formed, a portion of any circuitization layer may be covered by a protective coating. Such coatings may include, inter alia, an organic photoresist, a polyimide, an acrylic, or an epoxy. As an example, the protective coating 78 in FIG. 8 covers a portion of the fifth circuit line 72 and the second circuit line 34.

In FIG. 8: the fourth circuit line 70 is shown as on the top surface 18 of the substrate 10 and not embedded into the substrate 10; the fifth circuit line 72 is shown as on the bottom surface 19 of the substrate 10 and not embedded into the substrate 10; and the sixth circuit line 74 is shown as on the bottom surface 19 of the substrate 10 and not embedded into the substrate 10.

Any two circuit lines of different thickness may be formed to be conductively coupled such that a pad on one of the two circuit lines couples the substrate to an electronic assembly, such as a chip, and the other of the two circuit lines couples the substrate to an electronic carrier, such as a circuit card. See, e.g, FIGS. 10–12, to be discussed infra, for various illustrative electrical structures of the present invention. FIG. 8 illustrates that first circuit line 30 may be conductively coupled with fourth circuit line 70, and third circuit line 34 may be conductively coupled with fifth circuit line 72, which illustrate the electrical coupling of two circuit lines of different thickness located on the same surface of a substrate. The second circuit line 32 may be conductively coupled with sixth circuit line 74 by use of the PTH 12, thereby electrically coupling two circuit lines of different thickness located on opposite surfaces of a substrate. Any known variation of the electrical structure illustrated by the PTH 12 may be used to electrically couple two circuit lines of different thickness located on opposite surfaces of a substrate. For example, the second circuit line 32 may be electrically coupled to a first PTH, the sixth circuit line 74 may be electrically coupled to a second PTH, and the first PTH may be electrically coupled to the second PTH by a conductive plane within the substrate or by a plurality of electrically coupled conductive planes within the substrate.

The thicknesses $t_1$, $t_2$, $t_3$, and $t_4$ of the circuit lines (and associated pads) in FIGS. 1–8 should be in the range of about 3 microns to about 50 microns, as discussed in the "Related Art" section.

While FIGS. 1–8 illustrate thickness-varying circuit lines (and associated pads) on both the top surface 18 and the bottom surface 19 of the substrate 10, the present invention includes embodiments having thickness-varying circuit lines on either the top surface 18 or the bottom surface 19, but not on both surfaces.

Figure 9:
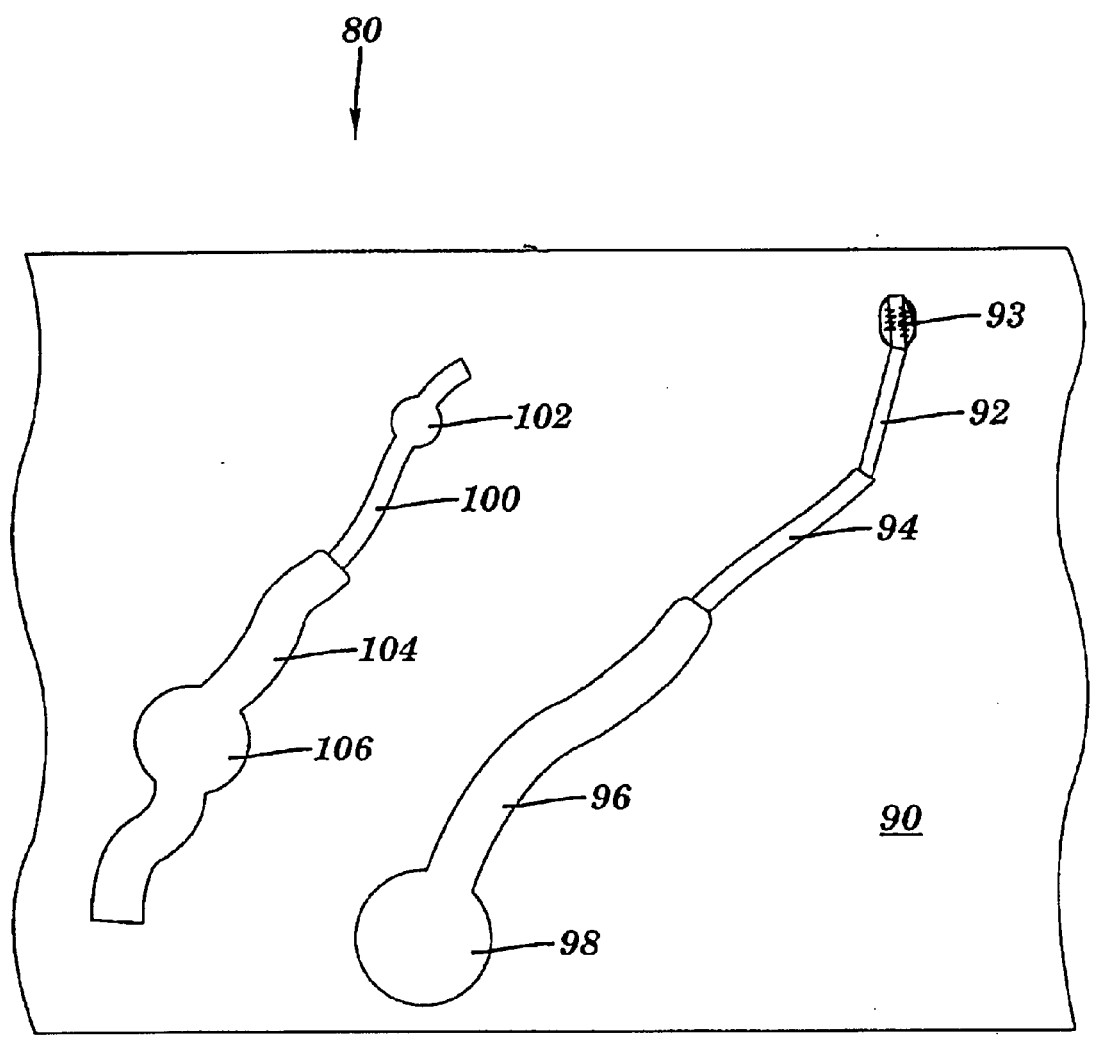
FIG. 9 depicts a top view of a first preferred embodiment of the structure of the present invention.

FIGS. 9–12 illustrate preferred electronic structures that could be formed by the method described supra and illustrated in FIGS. 1–8. FIG. 9 illustrates a top view of a first electrical structure 80, in accordance with a first preferred structural embodiment of the present invention. The first electrical structure 80 includes a substrate 90 which may represent a device such as a chip carrier. As stated in the "Related Art" section, a fine circuitization (including pads) has a thickness between about 3 microns and about 10 microns, a medium circuitization (including pads) has a thickness between about 10 microns and about 17 microns, and a thick circuitization (including pads) has a thickness between about 17 microns and about 50 microns. In FIG. 9, circuit line 92 has a fine circuitization, circuit lines 94 and 100 each have a medium circuitization, and circuit lines 96 and 104 each have a thick circuitization. Note that the relative thicknesses of circuit lines 92, 94, 96, 100, and 104 are not explicitly shown because FIG. 9 is a top view. FIG. 9 shows the thin circuit line 92 to be coupled the substrate 90, wherein the thin circuit line 92 is coupled to a medium circuit line 94, and wherein the medium circuit line 94 is coupled to a thick circuit line 96. A thin pad 93, which is suitable for coupling with a wirebond interconnect such as a gold wire, is positioned at an end of the thin circuit line 92. The wirebond interconnect may be used to electrically couple the thin pad 93 to an electronic assembly such as a chip. A thick pad 98, which is suitable for coupling with a large solder ball such as a BGA solder ball, is positioned at an end of the thick circuit line 96. The large solder ball may be used to electrically couple the in thick pad 98 to an electronic carrier such as a circuit card. FIG. 9 also shows a medium circuit line 100 coupled to the substrate 90, wherein the medium circuit line 100 is coupled to a thick circuit line 104. A medium pad 102, which is suitable for coupling with a small solder ball, is positioned within the medium circuit line 100. The small solder ball may be used to electrically couple the medium pad 102 to an electronic assembly, such as a chip, by any suitable method such as controlled collapse chip connection (C4). A thick pad 106, which is suitable for coupling with a large solder ball such as a BGA solder ball, is positioned within the thick circuit line 104.

Figure 10:
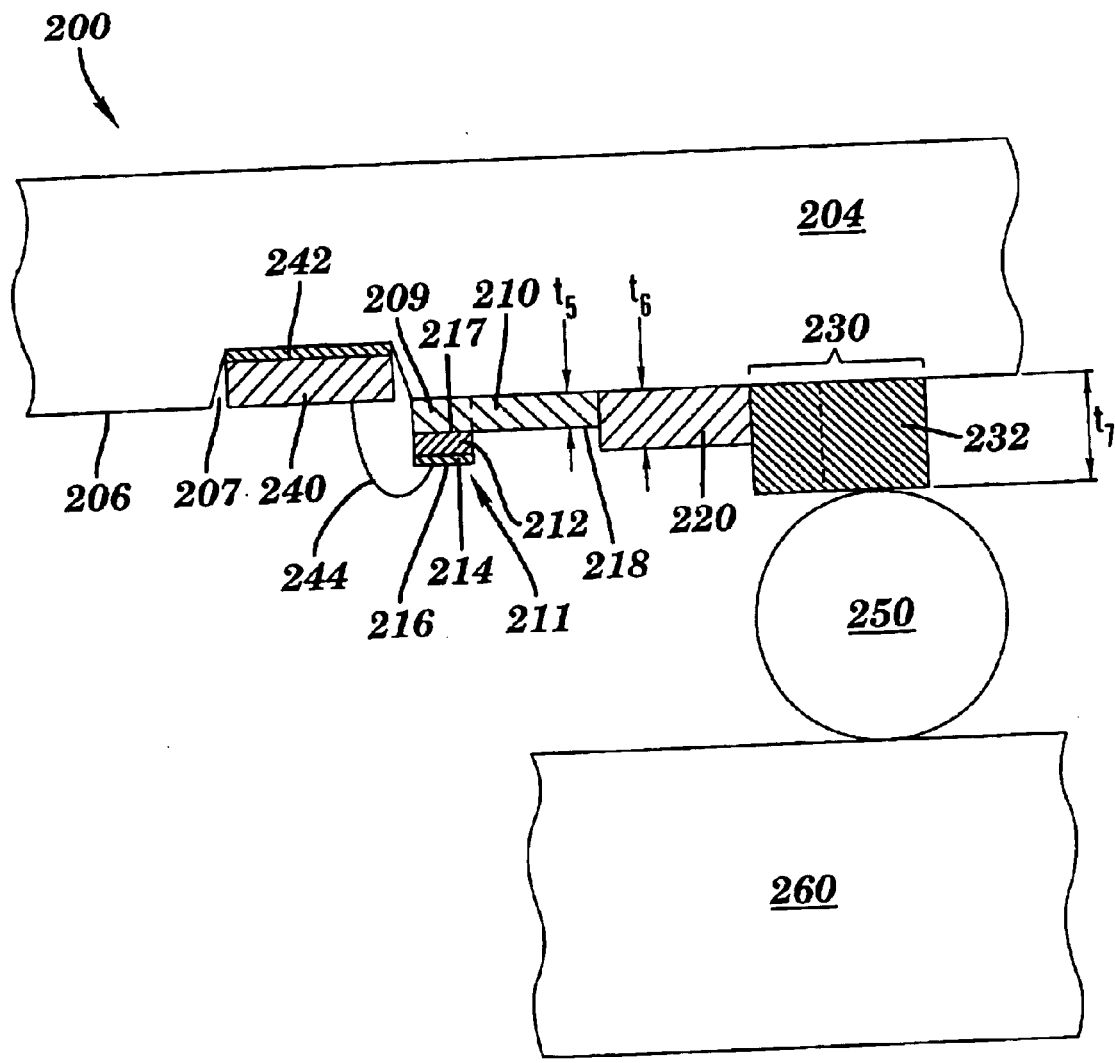
FIG. 10 depicts a front cross-sectional view of a second preferred embodiment of the structure of the present invention.

FIG. 10 illustrates a front cross-sectional view of a second electrical structure 200, in accordance with a second preferred structural embodiment of the present invention. The second electrical structure 200 includes a substrate 204 which may represent a device such as a chip carrier. In FIG. 10, an electronic assembly 240 (e.g., a chip) within an cavity 207 in a substrate 204 is coupled to the substrate 204 by use of an adhesive interface 242. A first circuit line 210 is coupled to a bottom surface 206 of the substrate 204, and is conductively coupled to the electronic assembly 240 by use of a wirebond interconnect 244. The wirebond interconnect 244 couples the electronic assembly 240 to an open surface 216 of a metallic coating 211. The metallic coating 211 is on a portion 217 of the bottom surface 218 of the first circuit line 210. The metallic coating 211 includes a first metal coating 212 on the bottom surface 218, and a second metal coating 214 on the first metal coating 212. The first circuit line 210 has a thickness t, which may be any thickness in the range of about 3 microns to about 50 microns, preferably in a range of about 3 microns to about 10 microns. As an example, the first circuit line 210 may include copper, the first metal coating 212 may include nickel, the second metal coating 214 may include gold, and the wirebond interconnect 244 may include a gold wire. The "pad" to which the wirebond interconnect 244 is attached includes the volumetric portion 209 of the first circuit line 210 that is beneath the metallic coating 211. A second circuit line 220 is coupled to the bottom surface 206 of the substrate 204, and is conductively coupled to the first circuit line 210. The second circuit line 220 has a thickness $t_6$ which may be any thickness in a range of about 3 microns to about 50 microns, other than $t_5$. While $t_6$ is shown in FIG. 10 as exceeding $t_5$, $t_6$ may nevertheless be less than $t_5$. A third circuit line 230, of thickness $t_7$ where $t_7 \neq t_6$ and $t_7 > t_5$, is coupled to the bottom surface 206 of the in substrate 204 and is conductively coupled to the second circuit line 220. The third circuit line 230 includes a pad 232 which is ply coupled to a solder ball 250, wherein the pad 232 includes the volumetric portion of the third circuit line 230 that interfaces with the solder ball 250. If the solder ball 250 is a BGA solder ball connected to an electronic device 260 such as an electronic carrier (e.g., circuit card), where the BGA solder ball has a diameter in a range of about 25 mils to about 30 mils, then $t_7$ should be in the range of about 17 microns to about 50 microns. If the solder ball 250 is a small solder ball connected to an electronic device 260 such as an electronic assembly (e.g., chip), where the small solder ball has a diameter of about an order of magnitude less than the diameter of a BGA solder ball (i.e, about 2 to about 3 mils), then t, should be in a range of about 10 microns to about 50 microns, preferably in a range of about 10 microns to about 17 microns.

In FIG. 10: the first circuit line 210 is shown as on the bottom surface 206 of the substrate 204 and not embedded into the substrate 204; the second circuit line 220 is shown as on the bottom surface 206 of the substrate 204 and not embedded into the substrate 204; and the third circuit line 230 is shown as on the bottom surface 206 of the substrate 204 and not embedded into the substrate 204.

Figure 11:
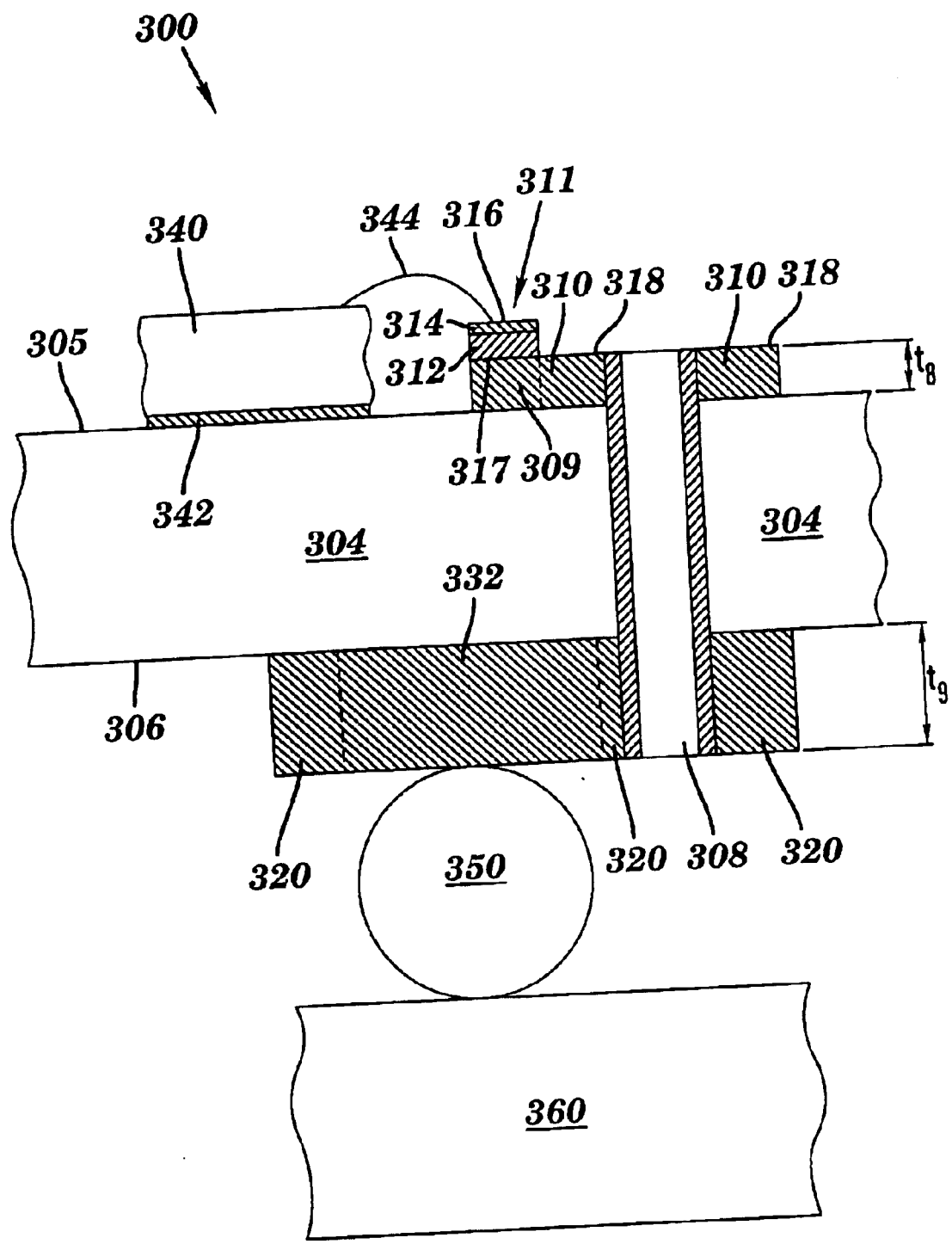
FIG. 11 depicts a front cross-sectional view of a third preferred embodiment of the structure of the present invention.

FIG. 11 illustrates a front cross-sectional view of a third electrical structure 300, in accordance with a third preferred structural embodiment of the present invention. The third electrical structure 300 includes a substrate 304 which may if, represent a device such as a chip carrier. In FIG. 11, an electronic assembly 340 (e.g., a chip) on a top surface 305 of a substrate 304 is coupled to the substrate 304 by use of an adhesive interface 342. A first circuit line 310 is coupled to the top surface 305 of the substrate 304, and is conductively coupled to the electronic assembly 340 by use of a wirebond interconnect 344. The wirebond interconnect 344 couples the electronic assembly 340 to an open surface 316 of a metallic coating 311. The metallic coating 311 is on a portion 317 of the top surface 318 of the first circuit line 310. The metallic coating 311 includes a first metal coating 312 on the top surface 318 of the first circuit line 310, and a second metal coating 314 on the first metal coating 312. The first circuit line 310 has a thickness $t_6$ which may be any thickness in the range of about 3 microns to about 50 microns, preferably in a range of about 3 microns to about 10 microns. The first circuit line 310 and the metallic coating 311 may include the same materials as stated supra in the example for the first circuit line 210 and metallic coating 211 in FIG. 10. The "pad" to which the wirebond interconnect 344 is attached includes the volumetric portion 309 of the first circuit line 310 that is beneath the metallic coating 311. A second circuit line 320, of thickness to where $t_9$ is unequal to $t_8$ and preferably greater than $t_8$, is coupled to the bottom surface 306 of the substrate 304, and is conductively coupled to the first circuit line 310 by a PTH 308. The second circuit line 320 includes a pad 332 which is coupled to a solder ball 350, wherein the pad 332 includes the volumetric portion of the second circuit line 320 that interfaces with the solder ball 350. The solder ball 350 may be coupled to an electronic device 360 such as an electronic carrier (e.g., circuit card) or an electronic assembly (e.g., chip). Ranges of values for the thickness to and the solder ball 350 diameter are based on the same considerations as are the ranges of values for thickness t, and solder ball 250 diameter, respectively, as discussed supra for FIG. 10.

In FIG. 11: the first circuit line 310 is shown as on the top surface 305 of the substrate 304 and not embedded into the substrate 304; and the second circuit line 320 is shown as on the bottom surface 306 of the substrate 304 and not embedded into the substrate 304.

Figure 12:
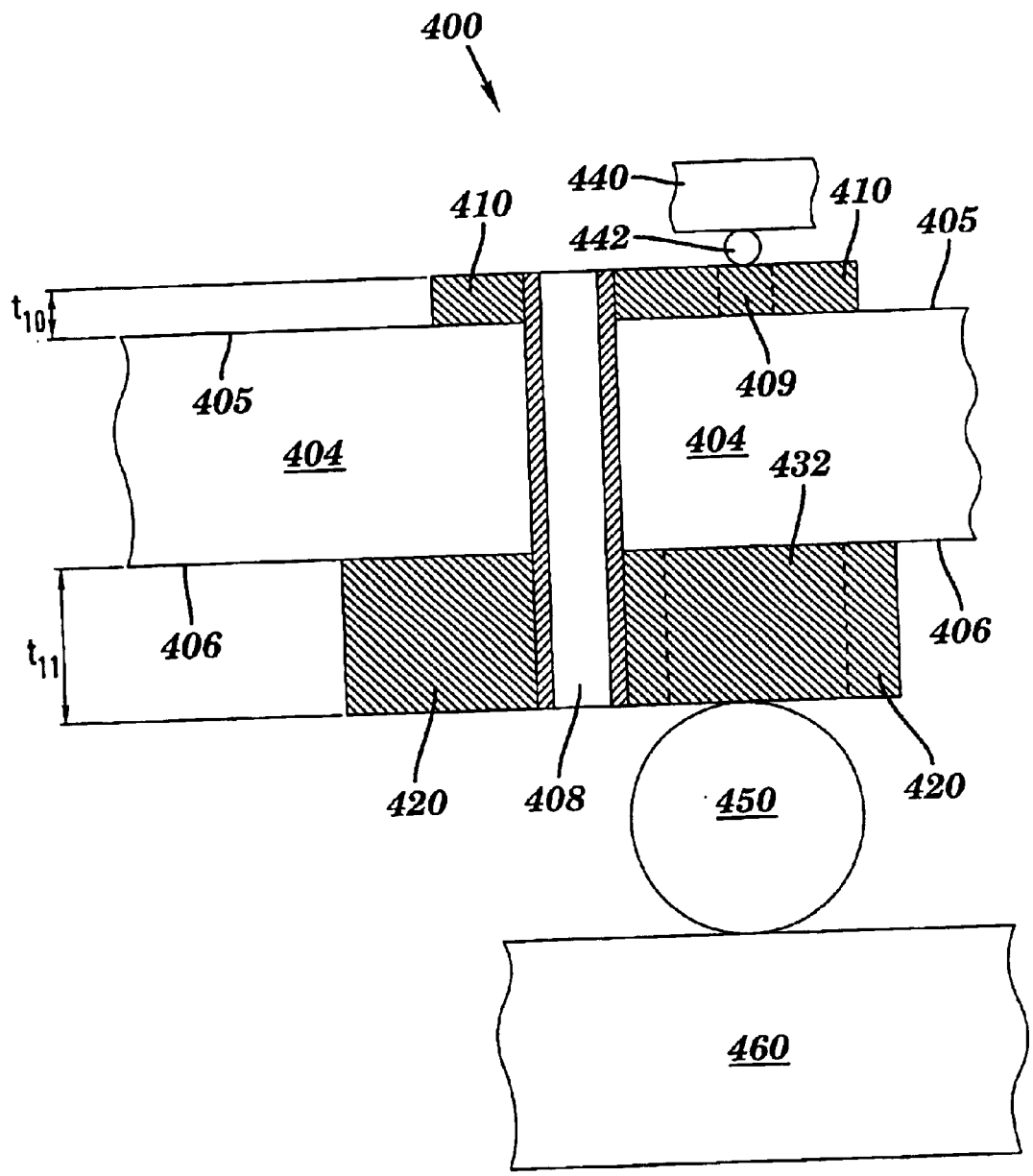
FIG. 12 depicts a front cross-sectional view of a fourth preferred embodiment of the structure of the present invention.

FIG. 12 illustrates a front cross-sectional view of a fourth electrical structure 400, in accordance with a fourth preferred structural embodiment of the present invention. The fourth electrical structure 400 includes a substrate 404 which may represent a device such as a chip carrier. In FIG. 12, a first circuit line 410 is coupled to a top surface 405 of a substrate 404. An electronic assembly 440 (e.g., a chip) is conductively coupled to the first circuit line 410 by use of an interfacing small solder ball 442 such as a C4 solder ball having a diameter between about 2 mils and about 3 mils. The first circuit line 410 has a thickness $t_{10}$ which may be any thickness in the range of about 10 microns to about 50 microns, preferably in a range of about 10 microns to about 17 microns. The "pad" to which the YS small solder ball 442 is attached includes the volumetric portion 409 of the first circuit line 410 that is beneath the small solder ball 442. A second circuit line 420, of thickness $t_{11}$ where $t_{11}$ is unequal to $t_{10}$, is coupled to the bottom surface 406 of the substrate 404, and is conductively coupled to the first circuit line 410 by a PTH 408. The second circuit line 420 includes a pad 432 which is coupled to a solder ball 450, wherein the pad 432 includes the volumetric portion of the second circuit line 420 that interfaces with the solder ball 450. The solder ball 450 may be coupled to an electronic device 460 such as an electronic carrier (e.g., circuit card) or an electronic assembly (e.g., chip). Ranges of values for the thickness $t_{11}$ and the solder ball 450 diameter are based on the same considerations as are the ranges of values for thickness t, and solder ball 250 diameter, respectively, as discussed supra for FIG. 10.

In FIG. 12: the first circuit line 410 is shown as on the top surface 405 of the substrate 404 and not embedded into the substrate 404; and the second circuit line 420 is shown as on the bottom surface 406 of the substrate 404 and not embedded into the substrate 404.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:
   a substrate;
   a first circuit line including a first portion and a second portion, wherein the second portion of the first circuit line consists of a first conductive pad, wherein the first portion of the first circuit line has a first thickness extending in a first direction perpendicular to a surface of the substrate, wherein the first circuit line is in direct surface-to-surface contact with the surface of the substrate, and wherein the first circuit line is totally external to an interior of the substrate, wherein a width in a second direction of the second portion of the first substrate exceeds a width in the second direction of the first portion of the first substrate, wherein the second direction is oriented parallel to the surface of the substrate; and a second circuit line including a first portion and a second portion, wherein the second portion of the second circuit line consists of a second conductive pad, wherein the first portion of the second circuit line has a second thickness extending in the first direction perpendicular to the surface of the substrate, wherein the second circuit line is in direct surface-to-surface contact with the surface of the substrate, wherein the second circuit line is electrically coupled to the first circuit line, wherein the second thickness is unequal to the first thickness, wherein the second circuit line is totally external to the interior of the substrate, and wherein the first circuit line physically touches the second circuit line in direct surface-to-surface contact, and wherein a width in the second direction of the second portion of the second substrate exceeds a width in the second direction of the first portion of the second substrate;

an electronic assembly coupled to the first conductive pad; and an electronic carrier coupled to the second conductive pad.

2. The electronic structure of claim 1, wherein an end of the first circuit line includes the first conductive pad, and wherein an end of the second circuit line includes the second conductive pad.

3. The electronic structure of claim 1, further comprising a protective coating that covers a portion of a circuit line, wherein the circuit line includes the first circuit line and the second circuit line.

4. The electronic structure of claim 1, further comprising:
a first solder ball coupling the first conductive pad to the electronic assembly; and
a second solder ball coupling the second conductive pad to the electronic carrier.

5. The electronic structure of claim 4, wherein a diameter of the second solder ball is unequal to a diameter of the first solder ball.

6. The electronic structure of claim 4, wherein the electronic assembly comprises a chip, and wherein the electronic carrier comprises a circuit card.

7. The electronic structure of claim 1, wherein the first conductive pad includes a metallic layer, and further comprising:
a first metallic coating over the metallic layer; and
a second metallic coating over the first metallic coating, wherein the first metallic coating inhibits diffusion of a metal from the second metallic coating into the metallic layer.

8. The electronic structure of claim 7, further comprising:
a wirebond interconnect coupled to the first conductive pad at the second metallic coating, wherein the electronic assembly is coupled to the wirebond interconnect; and
a solder ball coupled to the second conductive pad, wherein the electronic carrier is coupled to the solder ball.

9. The electronic structure of claim 8, wherein the metallic layer includes copper, wherein the first metallic coating includes nickel, wherein the metal of the second metallic coating is selected from the group consisting of gold and palladium, and wherein the wirebond interconnect includes a gold wire.

10. The electronic structure of claim 8, wherein the electronic assembly comprises a chip, and wherein the electronic carrier comprises a circuit card.

11. An electronic structure, comprising:

a substrate;

a first circuit line including a first portion and a second portion, wherein the second portion of the first circuit consists of a first conductive pad, wherein the first portion of the first circuit line has a first thickness extending in a direction perpendicular to a surface of the substrate at which the first circuit line is coupled to the substrate, and wherein the first circuit line is totally external to an interior of the substrate and is in direct surface-to-surface contact with the substrate;

a second circuit line including a first portion and a second portion, wherein the second portion of the second circuit line consists of a second conductive pad, wherein the first portion of the second circuit line has a second thickness extending in the direction perpendicular to the surface of the substrate at which the second circuit line is coupled to the substrate, wherein the second circuit line is electrically coupled to the first circuit line, wherein the second thickness is unequal to the first thickness, and wherein the second circuit line is totally external to the interior of the substrate and is in direct surface-to-surface contact with the substrate; and a third circuit line coupled to the substrate, wherein the third circuit line has a third thickness that is unequal to both the first thickness and the second thickness, wherein a portion of the third circuit line is electrically coupled to a portion of the first circuit line, wherein a portion of the third circuit line is electrically coupled to a portion of the second circuit line, wherein the third thickness extends in the direction perpendicular to the surface of the substrate at which the third circuit line is coupled to the substrate, wherein the third circuit line is totally external to the interior of the substrate and is in direct surface-to-surface contact with the substrate, wherein the third circuit line physically touches the first circuit line in direct surface-to-surface contact, and wherein the third circuit line physically touches the second circuit line in direct surface-to-surface contact;

an electronic assembly coupled to the first conductive pad; and an electronic carrier coupled to the second conductive pad.

12. The electronic structure of claim 11, wherein the first conductive pad includes a metallic layer, and further comprising:
a first metallic coating over the metallic layer; and
a second metallic coating over the first metallic coating, wherein the first metallic coating inhibits diffusion of a metal from the second metallic coating into the metallic layer.

13. The electronic structure of claim 12, further comprising:
a wirebond interconnect coupling the first conductive pad at the second metallic coating to the electronic assembly; and
a solder ball coupling the second conductive pad to the electronic carrier.

14. The electronic structure of claim 13, wherein the electronic assembly comprises a chip, and wherein the electronic carrier comprises a circuit card.

* * * * *

UNITED STATES PATENT AND TRADEMARK OFFICE
CERTIFICATE OF CORRECTION

PATENT NO. : 6,900,545 B1 Page 1 of 1
APPLICATION NO. : 09/526957
DATED : May 31, 2005
INVENTOR(S) : Sebesta et al.

It is certified that error appears in the above-identified patent and that said Letters Patent is hereby corrected as shown below:

On the Title Page; Item (56)
Under Foreign Patent Documents on page 1
Line 8, delete "100093215 A" and insert --10093215 A--

Column 10
Line 61, delete "and"

Column 11
Line 12, delete "and"

Column 12
Line 25, delete "and"

Signed and Sealed this

Eighteenth Day of September, 2007

JON W. DUDAS
*Director of the United States Patent and Trademark Office*

UNITED STATES PATENT AND TRADEMARK OFFICE
CERTIFICATE OF CORRECTION

PATENT NO. : 6,900,545 B1  Page 1 of 1
APPLICATION NO. : 09/526957
DATED : May 31, 2005
INVENTOR(S) : Sebesta et al.

It is certified that error appears in the above-identified patent and that said Letters Patent is hereby corrected as shown below:

Under Foreign Patent Documents on page 1
Line 8, delete "100093215 A" and insert --10093215 A--

Column 10
Line 61, delete "and"
Lines 64 and 65, delete "substrate" and insert --circuit line--

Column 11
Line 12, delete "and"
Lines 16 and 18, delete "substrate" and insert --circuit line--

Column 12
Line 25, delete "and"

This certificate supersedes the Certificate of Correction issued September 18, 2007.

Signed and Sealed this

Eleventh Day of March, 2008

JON W. DUDAS
*Director of the United States Patent and Trademark Office*